United States Patent [19]
Chalco

[11] Patent Number: 4,970,365
[45] Date of Patent: Nov. 13, 1990

[54] METHOD AND APPARATUS FOR BONDING COMPONENTS LEADS TO PADS LOCATED ON A NON-RIGID SUBSTRATE

[75] Inventor: Pedro A. Chalco, Yorktown Heights, N.Y.

[73] Assignee: International Business Machines Corporation, Armonk, N.Y.

[21] Appl. No.: 489,838

[22] Filed: Mar. 2, 1990

Related U.S. Application Data

[63] Continuation of Ser. No. 413,930, Sep. 28, 1989, abandoned.

[51] Int. Cl.⁵ .............................................. B23K 26/00
[52] U.S. Cl. ........................... 219/121.63; 219/121.64
[58] Field of Search ...................... 219/121.63, 121.64, 219/121.6, 121.85; 228/1.1

[56] References Cited

U.S. PATENT DOCUMENTS 3,304,403  2/1967  Harper ........................... 219/121.63
4,330,699  5/1982  Farrow ........................ 219/121 LD
4,534,811  8/1985  Ainslie et al. ...................... 156/73.1
4,700,044  10/1987  Hokanson et al. ......... 219/121.64 X

OTHER PUBLICATIONS

P. Chalco et al., "Discrete Wire Bonding Using Laser Energy", *Semiconductor International,* May, 1988.
IBM Technical Disclosure Bulletin, "Intrinsic-Thermocouple Process Monitor", vol. 29, No. 11, Apr., 1987, p. 4870.
Research Disclosure, "Diffusion Bonding", Jan., 1987, No. 273.

*Primary Examiner*—C. L. Albritton
*Attorney, Agent, or Firm*—Philip J. Feig

[57] ABSTRACT

Component leads are bonded to pads disposed on a non-rigid substrate by the application of a combination of laser energy and ultrasonic energy. The pads preferably are bare copper pads, without a noble metal coating or a chemical pretreatment, and the non-rigid substrate is preferably an epoxy printed circuit board.

68 Claims, 10 Drawing Sheets

METHOD AND APPARATUS FOR BONDING COMPONENTS LEADS TO PADS LOCATED ON A NON-RIGID SUBSTRATE

This application is a continuation of application Ser. No. 07/413,930 filed Sept. 28, 1989, now abandoned.

BACKGROUND OF THE INVENTION

The present invention relates to solderless bonding of component leads to pads located on a non-rigid substrate. Specifically, the invention relates to solderless bonding of fine-lead TAB components to pads disposed on an epoxy printed circuit board and, more specifically, relates to the use of a combination of laser energy and ultrasonic energy to bond leads to bare copper pads.

Electronic card assembly has recently evolved from Plated-Thru-Hole to Surface Mounted Technology. The current state of the art in low input/output component (50 mil lead pitch) attachment to an epoxy (FR-4) printed circuit board is solder paste screen printing on the pads, followed by placement of the component, and solder reflow. Components having 25 mil lead spacing, such as flat-packs, are also assembled and attached selectively using a Pick-Place-Attach tool which solders the leads on pads previously covered with solder.

Another technique is gang bonding where thermodes apply a combination of pressure and heat to achieve simultaneous thermocompression bonding of the leads to the pads. While gang bonding provides high throughput rates, the technique has long been plagued with problems such as chip cracking when inner-lead bonding and defective solder joints when outer-lead bonding. Single-point interconnection is currently emerging as a viable alternative to simultaneous or gang bonding of leads to pads for both inner-lead bond and outer-lead bonding.

Tape-Automated-Bonding (TAB) packages with fine leads are being developed for high function electronic products. In an attempt to reduce the problems associated with gang bonding, an alternative technique, Single-Point-TAB (SPT) bonding has been developed where the bonding is performed sequentially using a fine-point tip and heating the substrate to a temperature above the threshold temperature for bonding.

A major problem encountered when using Single-Point-TA bonding for outer-lead bonding is the heating limitations of the epoxy substrate. Therefore, heating of the bonding tip is a more practical approach for SPT bonding. While electrically heated tips are limited to slow throughput bonding operations, it has been shown that laser-heated tips are capable of providing bonding at high throughput rates.

Solderless lead-to-pad outer lead bonding for attaching fine pitch components to epoxy substrates has been attempted using conventional thermosonic techniques in which the entire substrate is heated and bonding is performed seriatim, one lead at a time, using a fine bonding tip energized with ultrasonic pulses. Such efforts generally are unsuccessful as a result of poor coupling of the ultrasonic energy to the epoxy substrate. Generally, good ultrasonic energy coupling requires that the pads be located on a rigid substrate. In order to compensate for the inherent poor coupling, higher heating temperatures have been tried with negative results since the temperature may reach a level where heat damage occurs to the substrate.

The use of laser energy for bonding wires to pads is well known in the art. For example, in IBM Technical Disclosure Bulletin, Vol. 29, No. 11, April 1987 entitled "Intrinsic—Thermocouple Process Monitor" a continuous laser beam of short duration is delivered via an optical fiber to heat a tungsten bonding tip which, in turn, melts a gold-coated copper wire and bonds the wire to an EC pad located on an aluminum or glass ceramic rigid substrate. The input laser power is controlled by feeding back a signal commensurate with the wire temperature during bonding. A similar device is described in an article entitled "Discrete Wire Bonding Using Laser Energy" by P. Chalco et al, *Semiconductor International*, May 1988. Solderless bonding of copper leads to copper pads using laser energy is described in an article entitled "Diffusion Bonding", *Research Disclosure*, No. 273, January 1987. The combined use of laser and ultrasonic energy for bonding surfaces together is described in U.S. Pat. No. 4,534,811 issued Aug. 13, 1985, entitled "Apparatus For Thermo Bonding Surfaces" and assigned to the same assignee as the present application. A non-contact laser/ultrasonic welding technique where ultrasonic energy is used for cleaning the weld joint is described in U.S. Pat. No. 4,330,699, issued May 18, 1982 and entitled "Laser/Ultrasonic Welding Technique."

In each of the above-mentioned prior art references there is an absence of bonding a lead to a pad located on a resilient, non-rigid substrate, such as an epoxy printed circuit board. The ability to bond leads directly onto bare-copper pads located on epoxy printed circuit boards is an important aspect of the present invention.

The present invention overcomes the above-described problems associated with solderless outer-lead bonding of leads to organic substrates, such as FR-4 epoxy, by bonding gold-coated leads to bare-copper pads using a laser-assisted thermocompression technique where the laser energy is used to pulse heat a fine-point capillary tip. The tip is placed in forced intimate contact with a superposed lead and pad.

A pulse of ultrasonic energy is applied to the heated tip to achieve a diffusion bond at the interface of the lead and pad.

Bond reliability is greatly improved as a result of the absence of solder and the fact that only three parameters control the bonding process. The three parameters are tip pressure, laser power and bonding time. In order to achieve bonding rates comparable to that achieved when gang bonding, a highly controllable laser heating pulse and a fast x-y stepper such as is currently in use in wirebonding applications are combined to achieve bonding rates in the order of 50 to 100 milliseconds per bond.

The present invention also solves the problem of achieving reliable solderless bonds with bare-copper pads without resultant heat damage by bonding the lead to the pad using a combination of laser energy and ultrasonic energy. In prior methods, long duration (>300 ms) laser-sonic pulses were used to bond wires to gold coated pads on rigid (ceramic or alumina) substrates. In contrast, the present invention concerns a bonding method for joining leads to bare-copper pads disposed on a non-rigid (epoxy) substrate using short duration (<100 ms) laser-sonic pulses.

The tip used for bonding the leads to the pads contain a small diameter cavity in which the laser energy is reflected and absorbed for heating the tip. The frontal surface of the tip is composed a centrally disposed hole, forming the cavity, and two grooves intersecting at a substantially 90° angle in the vicinity of the cavity. The four islands thus created impress a footprint into the lead in intimate contact with the tip. The footprint so produced provides an indication of the weld quality.

Another feature of the present invention resides in the ability to analyze the footprint impressed by a bonder tip on a lead bonded to a pad in order to determine bond quality. An intelligent fast inspection tool analyzes the footprint and provides a signal indicative of the acceptance or rejection of the bond before a subsequent bond is attempted.

SUMMARY OF THE INVENTION

A principal object of the present invention is therefore, the provision of a process for bonding leads to pads located on a non-rigid substrate by the combined application of laser energy and ultrasonic energy.

Another object of the present invention is the provision of a process for bonding leads to bare copper pads located on a non-rigid substrate by the combined application of laser energy and ultrasonic energy.

A further object of the present invention is the provision of a process for bonding leads to bare copper pads located on an epoxy printed circuit board by the combined application of laser energy and ultrasonic energy.

A further object of the present invention is the provision of an apparatus for bonding leads to bare copper pads located on a non-rigid substrate by the combined application of laser energy and ultrasonic energy.

A still further object of the present invention is the provision of determining bond quality by analysis of the bond footprint formed when bonding leads to pads.

Further and still other objects of the present invention will become more clearly apparent when the following description is read in conjunction with the accompanying drawings.

DETAILED DESCRIPTION

Figure 1A:
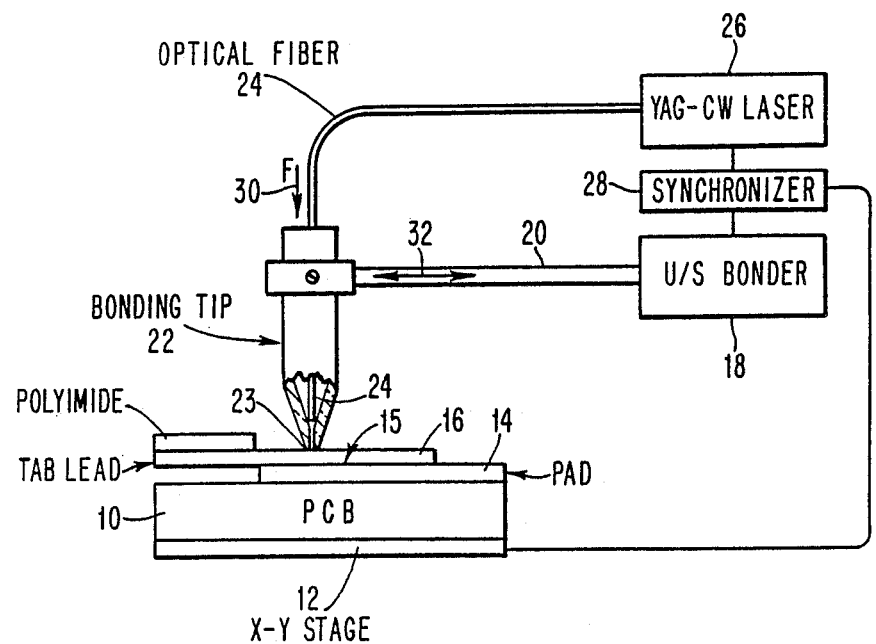
FIG. 1A is a schematic diagram of a preferred embodiment for practicing the present invention.

Referring now to the figures and to FIG. 1A in particular, there is shown a schematic diagram (not to scale) of an embodiment for practicing the invention. A non-rigid printed circuit board 10, preferably comprising an organic material such as epoxy and more particularly FR-4 epoxy, is disposed on a x-y positioning stage 12.

Disposed upon the non-rigid board 10 is a bare-copper pad 14 to be joined to a gold-coated copper lead 16 coupled to a component. An ultrasonic welding apparatus or bonder 18 is coupled to a horn or resonator 20 for coupling reciprocating vibratory motion from the bonder 18 to a bonding tip 22. Also coupled to the tip 22 via an optical fiber 24 is a laser 26 for heating the end of the tip contacting the lead 16.

Figure 1C:
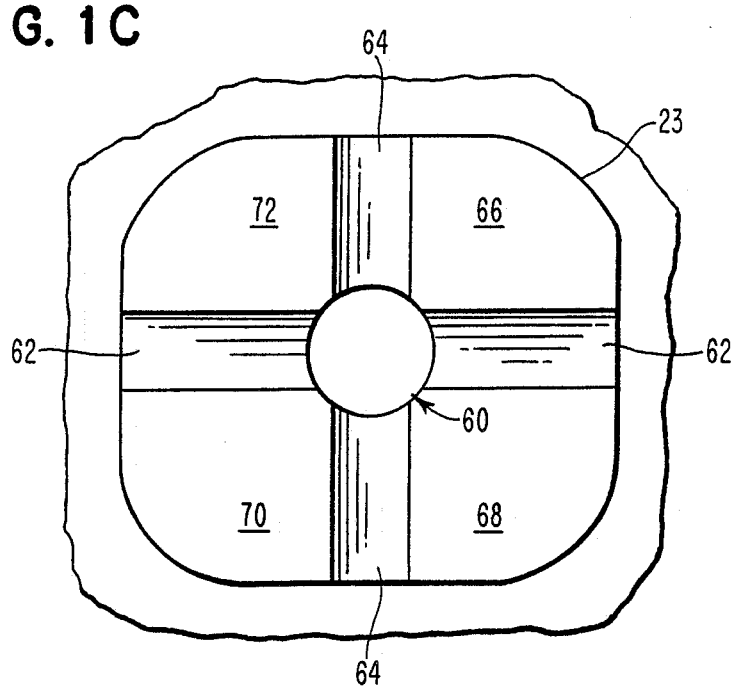
FIG. 1C is a bottom end view of the frontal surface of the bonder tip shown in FIG. 1A.
Figure 1B:
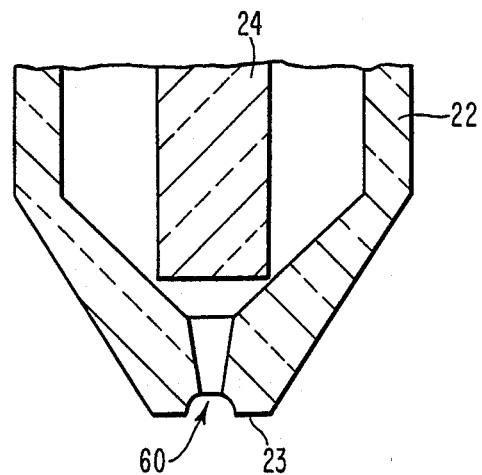
FIG. 1B is an exploded cross-sectional view of the bonder tip shown in FIG. 1A.

As best shown in FIG. 1B, the bonding tip 22 has a cylindrical hole 60, approximately 0.75 mm to 1 mm in diameter ending in a conical shape at the frontal surface 23, where the diameter tapers down to a cylindrical opening approximately 25μm in diameter and 250μm in length. In order to maximize coupling of the ultrasonic vibrating motion of the tip to the lead to be bonded, two grooves 62, 64, approximately 25μm in diameter, crossed 90 degrees to each other intersecting at the hole in the frontal surface are machined in the frontal surface 23, forming four islands 66, 68, 70 and 72 as shown in FIG. 1C.

The laser energy is provided along optical fiber 24 into the tip 22. The diameter of the fiber 24 is approximately 8 mils. The laser energy is coupled from the fiber 24 into the cavity 60. The laser energy is reflected by and absorbed at the wall of the cavity thereby heating the frontal region and frontal surface 23 of the tip.

It has been observed that providing a cavity with a much larger diameter than 1 mil results in the formation of standing waves within the cavity which reduces the heating efficiency and the ability to heat the tip by means of the laser energy.

A conventional ultrasonic bonding apparatus for joining metal workpieces operates by applying a static force in the direction of arrow 30 (i.e. in a direction normal to the interface of the workpieces to be joined) for urging the lead 16 into forced intimate contact with the pad 14 and simultaneously applying reciprocating vibratory motion to the tip 22 in the direction of double-headed arrow 32, i.e. in a direction normal to the direction of the applied force and parallel to the interface of the pars to be joined. After a predetermined time interval the vibratory motion ceases and the static force is removed and the lead is joined to the pad.

A synchronizer 28 is connected to the laser 26, ultrasonic bonder 18 and x-y stage 12 for controlling the sequence, timing and operation of the several apparatus.

In operation, a lead 16 is superposed on a respective pad 14 located on the non-rigid substrate 10. The x-y stage positions each lead and Pad to be joined sequentially under the bonding tip 22. Responsive to a signal from synchronizer 28 to the bonder 18, the tip 22 contacts the lead 16 and under the influence of the the force F, applied in the direction of arrow 30, the lead 16 is urged into forced intimate contact with the pad 14 along an interface 15. While the lead and pad are in intimate contact, the tip 22 undergoes reciprocating vibratory motion in the direction of arrow 32, i.e. in a direction parallel to the interface 15. Responsive to another signal from synchronizer 28 to laser 26 and concurrently with the application of ultrasonic energy, laser pulses traveling along optical fiber 24 inserted into tip 22 heat the distal end or frontal surface 23 of tip 22 contacting the lead 16. The manner of coupling laser pulses to a bonding tip for heating the tip is described, for instance, in Chalco et al supra. Preferably, the laser 26 is a YAG-CW, 1.06 μm laser. However, other IR lasers such as Argon-Ion are also useable in practicing the present invention. A shutter (not shown) in the path of the laser beam is activated by the signal from synchronizer 28 to laser 26 for causing laser pulses to travel along optical fiber 24. The laser energy is applied for a period of time required to bond the lead to the pad, typically 50 ms to 100 ms. The laser energy applied is sufficient to heat the frontal surface 23 of the tip for causing the lead to bond with the pad without damaging the substrate. As will be described hereafter, the laser pulse is typically less than 100 ms in duration and the laser power is typically in the range between 13 and 20 watts and preferably in the range between 13 and 18 watts. The applied static force is preferably in the range between 50 gm and 100 gm.

After a sufficient period of time required to bond the lead to the pad, the vibratory motion and laser pulses cease and the force is removed as the tip is removed from contact with the bonded lead.

The gold coated lead 16 is now directly bonded to the bare-copper pad 14 on the non-rigid substrate 10. The bonding cycle is repeated for each lead-pad pair until the component is bonded to the substrate at which time another component is joined to the same or a different substrate. The described apparatus is currently able to produce approximately 10 bonds per second.

Figure 2:
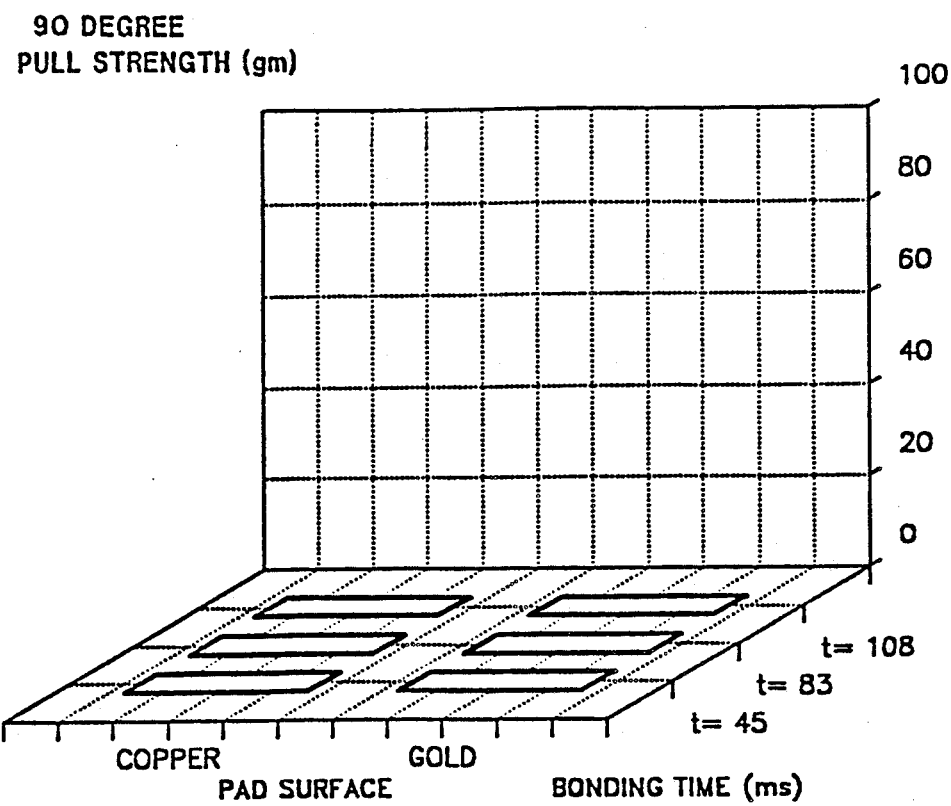
FIG. 2 is a graphical representation of the bond pull strength of leads joined to pads located on a non-rigid substrate when ultrasonic energy is applied in the absence of any laser energy.

FIG. 2 is a graphical representation illustrating that no bonding of 4 mil leads with center-to-center spacing of 8 mils to either copper and gold pad surfaces occurs when ultrasonic energy is applied in the absence of any laser energy. The measurements were made with the laser off, the force applied by the tip to the workpieces being in the range between 65 and 90 gram and ultrasonic energy being in the range of up to 560 mW. Even when the copper pad is coated with a layer of gold thereby creating a gold-to-gold interface, to eliminate oxide coatings on the bonding surface, no bonding occurs. The lack of bonding is believed to be due to the poor coupling of the ultrasonic energy from the tip to the pad when the pad is located on a non-rigid substrate, such as an epoxy board.

Figure 3A:
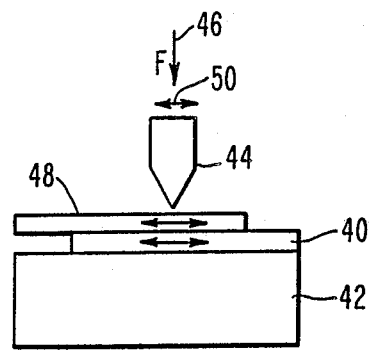
FIGS. 3A and 3B are schematic diagrams of the bonding of leads to pads where the pad is located on a rigid substrate and where the pad is located on a non-rigid substrate respectively.
Figure 3B:
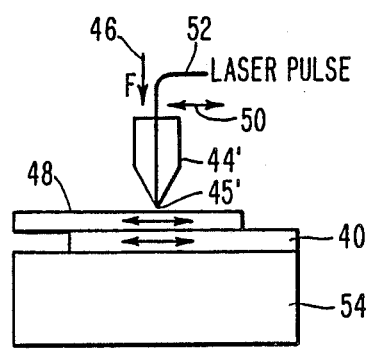

FIGS. 3A and 3B show schematically the effect of ultrasonic energy coupling to the bonding process. In FIG. 3A a pad 40 is located on a rigid substrate 42, such as ceramic or alumina material. An ultrasonic tip 44 is urged into contact with lead 48 by virtue of a force applied to the tip in the direction of arrow 46 urging the lead 48 into forced intimate contact with the pad 40. When activated, the tip 44 which is a portion of a horn coupled, in turn, to an ultrasonic bonder (not shown) undergoes reciprocating vibratory motion in the direction of double-headed arrow 50. In the case of a pad on a rigid substrate, the combination of an applied force F and reciprocating vibratory motion is capable of bonding the lead 48 to the pad 40.

By virtue of the rigid substrate, good ultrasonic energy coupling results in sufficient heat being generated along the interface of the pad 40 and lead 48 to form a bond.

In FIG. 3B, the apparatus shown in FIG. 3A is modified to include an optical fiber 52 inserted into tip 44' for coupling optical energy from a laser source to the tip 44' for heating the tip. The ultrasonic energy coupling is low because of the presence of a non-rigid substrate 54. In order to compensate for the low coupling, laser energy is provided to along fiber 52 to heat the frontal surface 45' of the tip 44' during bonding. In this embodiment, the role of the ultrasonic energy is primarily cleaning of any oxides on the bare-copper pad surface.

Figure 4:
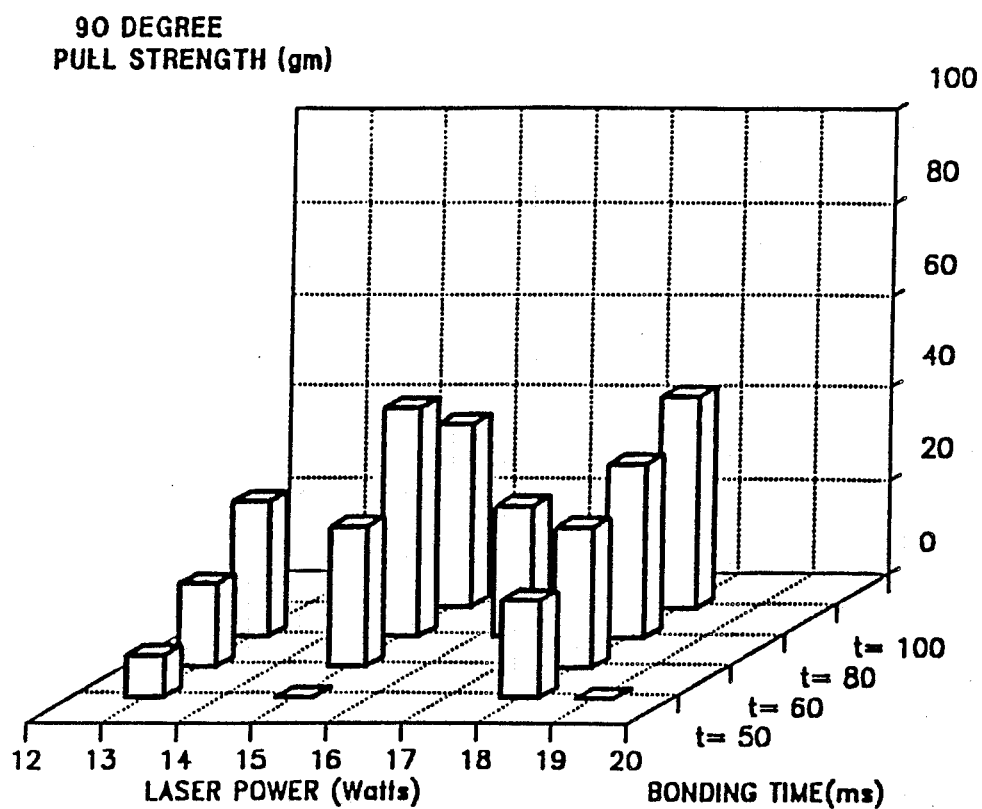
FIG. 4 is a graphical representation illustrating the relationship between bonding time, laser power and pull strength.

FIG. 4 graphically illustrates the relationship between bonding time and laser power and the bond 90 degree pull strength. The data was obtained with the ultrasonic bonder providing 560 mW of ultrasonic power at a static force F of 65 grams for joining bare-copper pads to gold-coated leads 4 mil wide with center-to-center spacing of 8 mils. In determining optimal operating conditions of bonding time and laser power for strong bonds, heat damage to the epoxy substrate must be avoided. These conditions will become more clearly apparent with reference to FIGS. 5 and 6.

Figure 5:
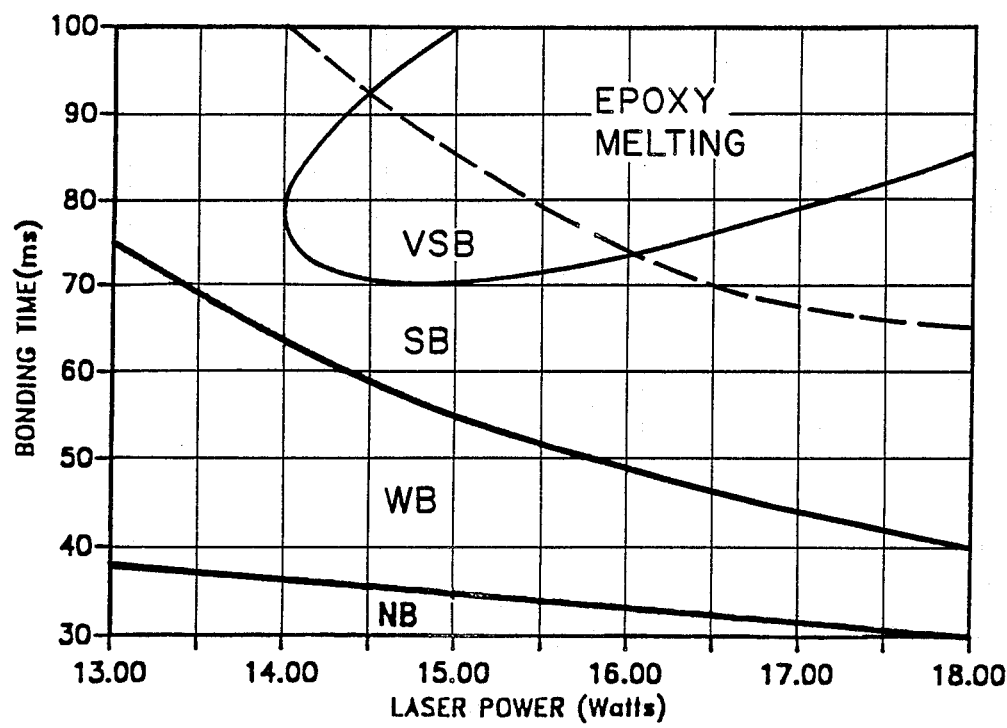
FIG. 5 is a graphical representation illustrating bond strength as a function of bonding time and laser power when a lead is bonded to a pad using a combination of laser energy and ultrasonic energy.

FIG. 5 is a graphical representation of the bond strength as a function of bonding time and laser power. The data was obtained with the ultrasonic bonder providing 560 mW of ultrasonic power and a static force F of 65 gm for bonding bare copper pads to leads 4 mil wide with center-to-center spacing of 8 mils. The region below the lowest curve, indicated NB, defines a range of operating conditions which results in no bonding of the lead to the pad. The region of the graph indicated as WB defines a range of operating conditions which results in weak bonding of the lead to the pad, i.e. a 90° pull strength less than 20 grams. The region of the graph indicated as SB defines to a range of operating conditions which results in strong bonding of the lead to the pad, i.e. a 90° pull strength in the range between 20 and 40 grams. The region of the graph indicated as VSB defines to a range of operating conditions which results in very strong bonding of the lead to the pad, i.e. a 90° pull strength greater than 40 gm. The region above the uppermost line defines to a range of operating conditions where the epoxy substrate incurs heat damage and melting.

The preferred operating conditions occur in the regions indicated SB and VSB where the bond strength is greater than approximately 20 grams and the epoxy substrate does not undergo heat damage. In addition to achieving a strong bond, it is also desirable to maintain the bonding time at a value less than approximately 80 ms in order to provide bonding rates competitive with alternative processes. The bonding time varies inversely with the laser power. For example, as shown in the process map of FIG. 5, for a 15-watt level of laser power and 560 mW of ultrasonic energy, the bonding time for achieving a strong bond or a very strong bond can vary between approximately 55 ms and 85 ms, i.e. a 30 ms window.

Experiments have shown that the applied static force F is not a critical parameter so long as the minimum force necessary to form a bond is provided. A force of at least approximately 60 grams has been found to provide acceptable bonding of the lead to the pad and the preferred range of static force is between approximately 50 gm and 100 gm.

Figure 6:
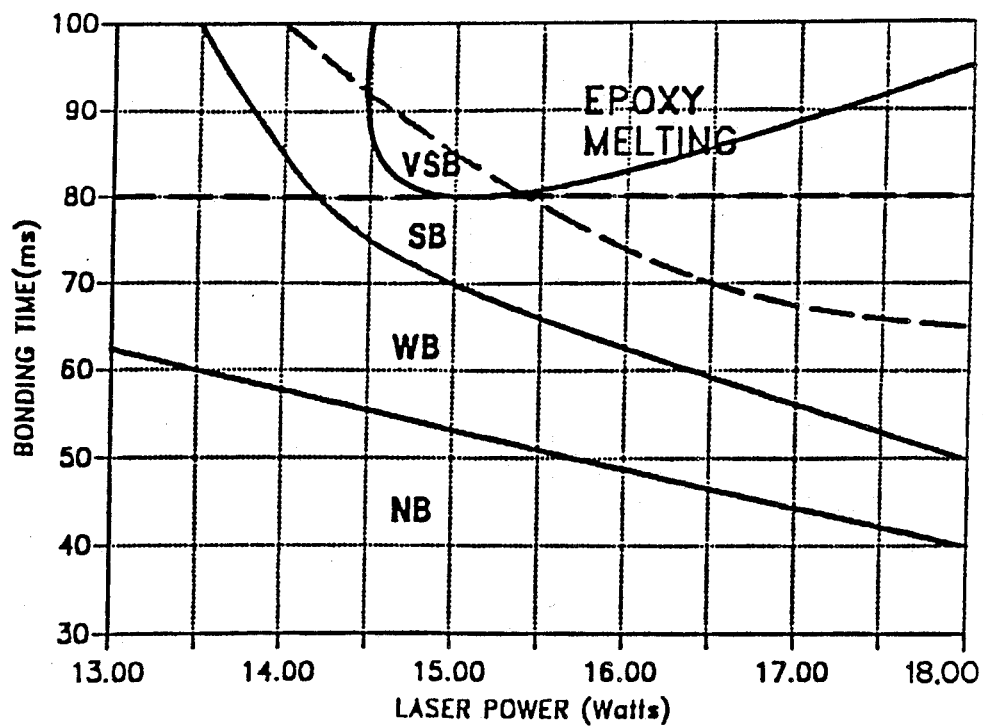
FIG. 6 is a graphical representation illustrating bond strength as a function of bonding time and laser power when a lead is bonded to a pad using only laser energy.

Process reliability is closely related to the duration of the process window. The application of ultrasonic energy with laser energy is important because of the resulting expansion of the size of the bonding time window. As shown in FIG. 6 where all the parameters used to generate the curves in FIG. 5 are unchanged, except that no ultrasonic energy is applied to the bonding tip, for a 15-watt level of laser power, the bonding time only varies between approximately 70 ms and 85 ms, i.e. a 15 ms window, in order to achieve a than approximately 20 grams.

The process maps shown in FIGS. 5 and 6 illustrate that highly controlled short pulse width laser energy is necessary to heat the bonding tip in order to obtain strong bonds without damaging the epoxy substrate. In contrast, an electrically-heated tip which usually includes a bulky power sources is difficult to control to the required precision.

Figure 7:
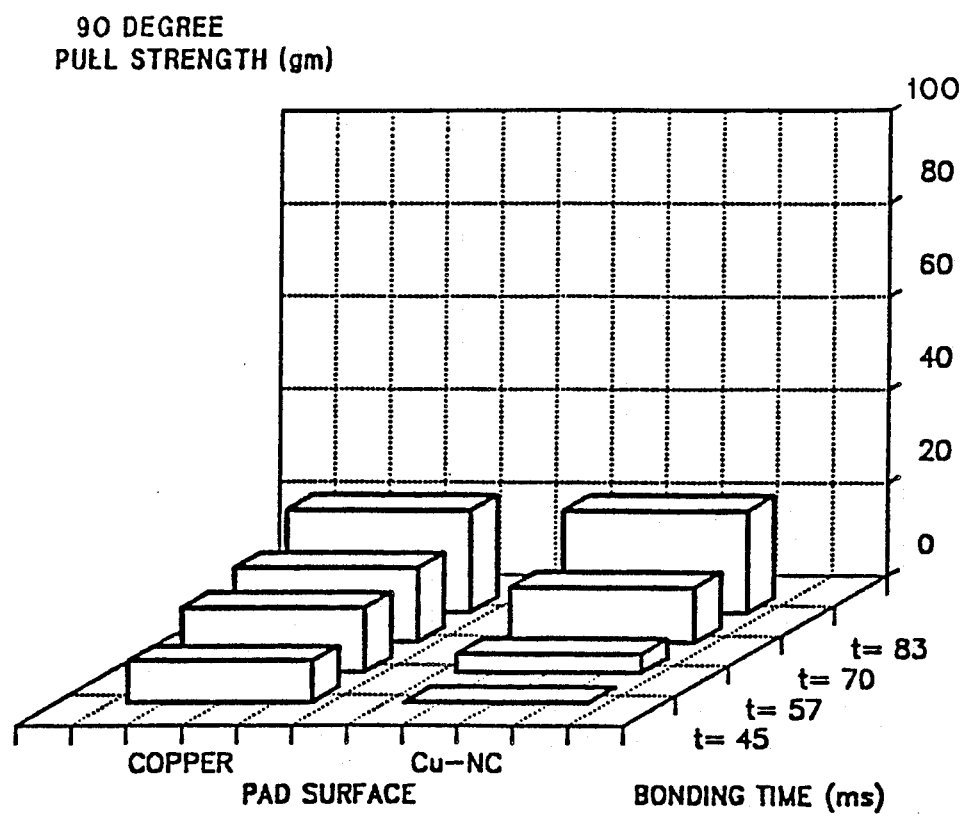
FIG. 7 is a graphical representation illustrating pull strength of leads bonded to bare copper pads and to copper pads which are not clean.
Figure 8:
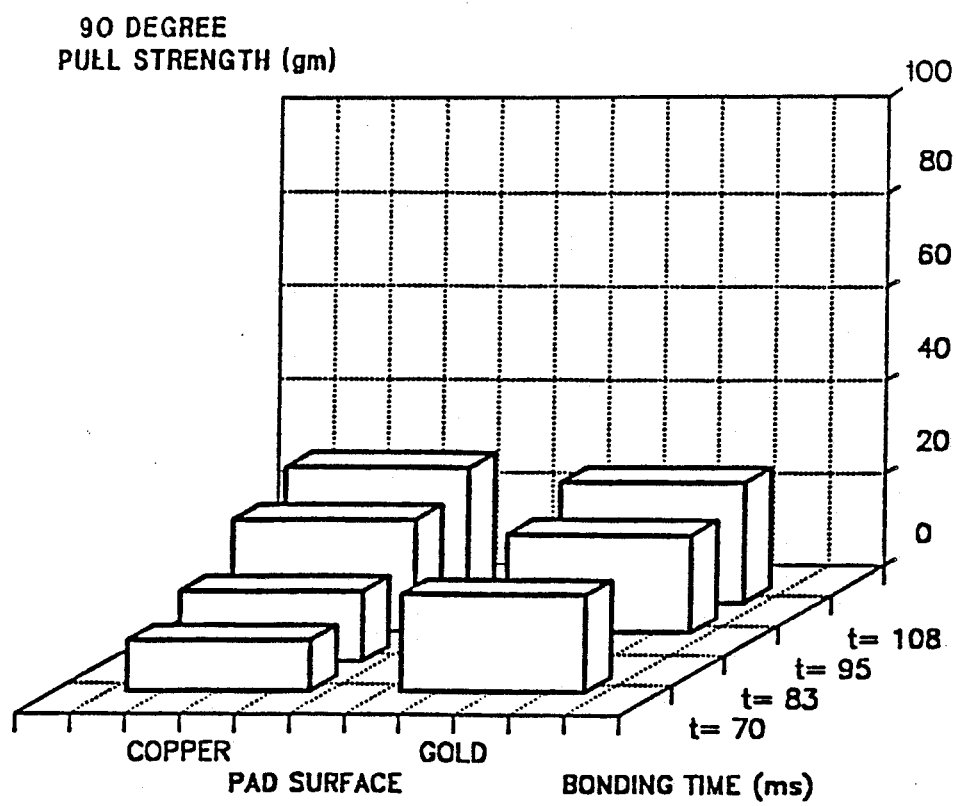
FIG. 8 is a graphic representation illustrating pull strength of leads bonded to bare copper pads and to gold coated copper pads.

Practicing the present invention results in the ability to bond leads to bare copper pads without gold coating or chemical cleaning of the pad. FIGS. 7 and 8 illustrate that equivalent bond strength is obtained for cleaned bare copper pads and bare copper pads which are not cleaned (FIG. 7) and cleaned bare copper pads and gold coated copper pads (FIG. 8). The data in FIG. 7 was measured with 13 W laser power, 360 mW of ultrasonic energy and a 65 gm static force applied by the bonder tip for bonding 4 mil wide gold-coated leads with center-to-center spacing of 8 mils. In FIG. 8, the data was obtained under the same operating condition except that a 90 gm static force was applied by the bonder tip. The 90 degree pull strength is approximately equivalent for all of the pad surfaces. The conclusion is that bare copper pads can be used in place of more expensive gold-coated or chemically treated copper pads when bonding leads to pads located on non-rigid substrates.

Figure 9A:
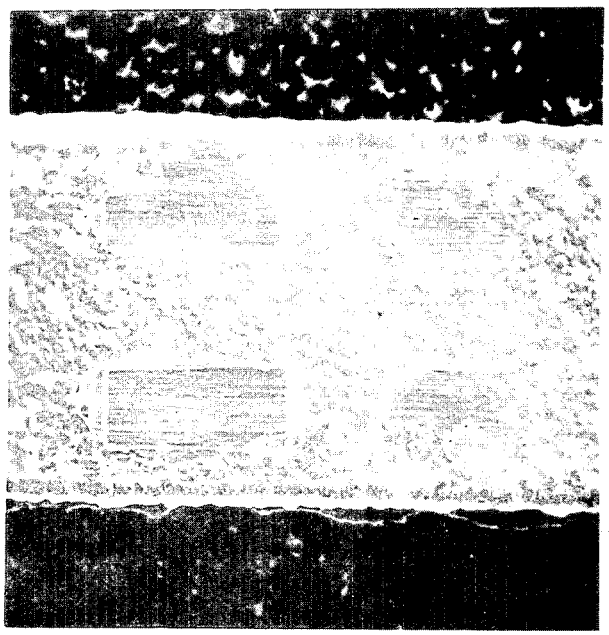
FIGS. 9A and 9B show the bond footprint of a poor bond and a strong bond respectively.
Figure 9B:
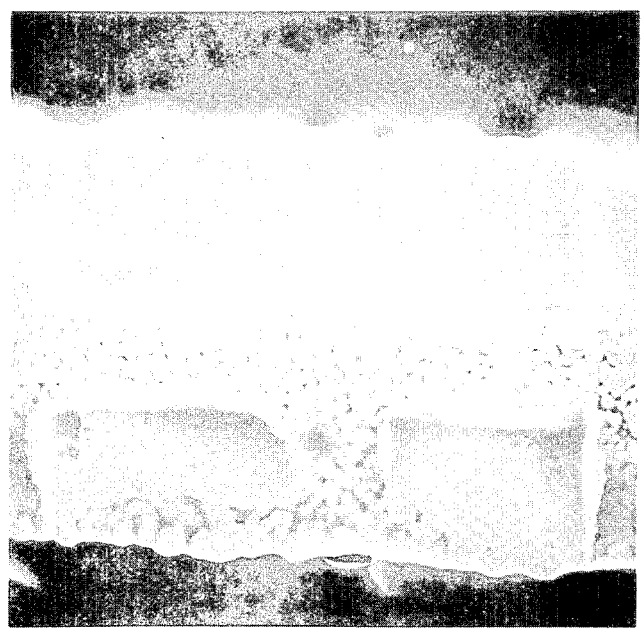

FIGS. 9A and 9B show two views of the footprint impressed by the bonder tip into the lead during the bonding process. The image in FIG. 9A was obtained after bonding with 15 watts of laser energy for 40 ms and 360 mW of ultrasonic energy and a static force of 65 gm for joining leads to bare copper pads disposed on FR-4 epoxy printed circuit boards. The leads were 4 mil wide with center-to-center spacing of 8 mils and the 90 degree pull strength was 0 gram (i.e., there was no bonding). The image in FIG. 9B was obtained after bonding with 15 watts of laser energy for 80 ms and 360 mW of ultrasonic energy and a static force of 65 gm for joining leads to bare copper pads disposed on FR-4 epoxy printed circuit boards. The leads were 4 mil wide with center-to-center spacing of 8 mils and the 90 degree pull strength was 39 grams.

The footprint in FIG. 9A, resulting from the islands 66, 68, 70 and 72 formed in frontal surface 23 of tip 22, shows a poorly-defined shape corresponding to a bond with zero strength. In contrast, the footprint in FIG. 9B shows a well defined shape indicative of a high strength bond. The bond in FIG. 9B was formed after the bonding time was increased from 40 ms to 80 ms. Recognition and analysis of the footprints in FIGS. 9A and 9B result in a reject signal when the footprint in FIG. 9A is analyzed and an accept signal when the footprint in FIG. 9B is analyzed. In other words, additional bonding time was required for the bonding operation when the "reject" footprint in FIG. 9A was analyzed.

It will be apparent to those skilled in the art, that the footprint is useful for in-process bond quality control. Instantaneous defect recognition immediately after bonding is readily obtainable by use of an intelligent inspection tool. The intelligent inspection tool is able to analyze the footprint and make a decision concerning bond quality (accept/reject) before proceeding with the next bonding cycle. The footprint is therefore, a quality "signature" useful for automated or intelligent inspection. The footprint analysis becomes particularly useful when compared to prior art techniques including tediously slow post-bonding visual inspection of solder joints. Visual inspection tools and tools capable of analyzing an image with respect to a stored image are per se known in the art.

While there has been described and illustrated a preferred method for bonding leads to pads disposed on a non-rigid substrate, it will be apparent to those skilled in the art that modifications and variations are possible without deviating from the broad scope of the present invention which shall be limited solely by the scope of the appended claims.

What is claimed is:

1. A method of bonding a metallic lead to a metallic pad disposed on a non-rigid substrate comprising the steps of:
   disposing the lead in contact with the pad disposed on a non-rigid substrate along a bond surface;
   contacting the lead with a bonding tip; applying laser energy to the tip sufficient to heat the tip;
   applying a predetermined static force to the tip in a direction substantially normal to the bond surface for causing the lead and the pad to be in forced intimate contact;
   applying ultrasonic energy to the tip for causing the tip to undergo reciprocating vibratory motion along an axis substantially parallel to the bond surface while in contact with the lead; and
   ceasing applying laser energy and ultrasonic energy and the predetermined static force after a predetermined period of time when the lead is bonded to the pad.

2. A method as set forth in claim 1 wherein said pad is a bare copper pad.

3. A method as set forth in claim 1 wherein said non-rigid substrate is an organic material substrate.

4. A method as set forth in claim 1 wherein said pad is a bare copper pad and said non-rigid substrate is an organic material substrate.

5. A method as set forth in claim 1 wherein said lead is gold coated.

6. A method of bonding a metallic lead to a metallic pad disposed on a non-rigid substrate comprising the steps of:
   disposing the lead in contact with the pad disposed on a non-rigid substrate along a bond surface;
   contacting the lead with a bonding tip;
   applying laser energy to the tip sufficient to heat the tip;
   applying a predetermined static force to the tip in a direction substantially normal to the bond surface for causing the lead and the pad to be in forced intimate contact and for impressing a footprint in the lead;
   applying ultrasonic energy in the tip for causing the tip to undergo reciprocating vibratory motion along an axis substantially parallel to the bond surface while in contact with the lead;
   ceasing applying laser energy and ultrasonic energy and the predetermined static force after a predetermined period of time, and analyzing the footprint in the lead for determining bond quality.

7. A method as set forth in claim 6, further comprising the step of providing an accent/reject indication responsive to said analyzing the footprint in the lead.

8. A method of joining a component having at least one metallic lead to a non-rigid substrate having at least one metallic pad thereon comprising the steps of:
   (a) disposing a lead in contact with a respective pad disposed on a non-rigid substrate along a bond surface;
   (b) contacting the lead with a bonding tip;
   (c) applying laser energy to the tip sufficient to heat the tip;
   (d) applying a predetermined static force to the tip in a direction substantially normal to the bond surface for causing the lead and the pad to be in forced intimate contact;
   (e) applying ultrasonic energy to the tip for causing the tip to undergo reciprocating vibratory motion along an axis substantially parallel to the bond surface while in contact with the lead; and
   (f) ceasing applying laser energy and ultrasonic energy and the predetermined static force after a predetermined period of time when the lead is bonded to the pad.

9. A method as set forth in claim 8 further comprising repeating steps (a) to (f) for each lead of the component and respective pad disposed on a non-rigid substrate.

10. A method as set forth in claim 8 wherein said non-rigid substrate is an organic material substrate.

11. A method as set forth in claim 8 wherein said pad is a bare copper pad.

12. A method as set forth in claim 8 wherein said non-rigid substrate is an epoxy substrate and said pad is a bare copper pad.

13. A method as set forth in claim 8 wherein said lead is gold coated.

14. A method as set forth in claim 9 wherein said non-rigid substrate is an organic material substrate.

15. A method as set forth in claim 9 wherein said pad is a bare copper pad.

16. A method as set forth in claim 9 wherein said non-rigid substrate is an epoxy substrate and said pad is a base copper pad.

17. A method as set forth in claim 9 wherein said lead is gold coated.

18. A component joined to a non-rigid substrate assembled in accordance with the method set forth in claim 8.

19. A component joined to a non-rigid substrate assembled in accordance with the method set forth in claim 9.

20. A component joined to a non-rigid substrate assembled in accordance with the method set forth in claim 10.

21. A component joined to a non-rigid substrate assembled in accordance with the method set forth in claim 12.

22. A component joined to a non-rigid substrate assembled in accordance with the method set forth in claim 14.

23. A component joined to a non-rigid substrate assembled in accordance with the method set forth in claim 16.

24. A method of joining a component having at least one metallic lead to a non-rigid substrate having at least one metallic pad thereon comprising the steps of:
   (a) disposing a lead in contact with a respective pad disposed on a non-rigid substrate along a bond surface;
   (b) contacting the lead with a bonding tip;
   (c) applying laser energy to the tip sufficient to heat the tip;
   (d) applying a predetermined static force to the tip in a direction substantially normal to the bond surface for causing the lead and the pad to be in forced intimate contact and for impressing a footprint in the lead;
   (e) applying ultrasonic energy to the tip for causing the tip to undergo reciprocating vibratory motion along an axis substantially parallel to the bond surface while in contact with the lead;
   (f) ceasing applying laser energy and ultrasonic energy and the predetermined static force after a predetermined period of time, and
   (g) analyzing the footprint in the lead for determining bond quality.

25. A method as set forth in claim 24, further comprising the steps of providing an accept/reject indication responsive to said analyzing the foot print in the lead.

26. A method as set forth in claim 24, further comprising repeating steps (a) to (g) for each lead of the component and respective pad disposed on a non-rigid substrate.

27. A method as set forth in claim 25, further comprising repeating steps (a) to (g) for a subsequent lead of the component and a subsequent respective pad disposed on a non-rigid substrate responsive to the providing of an accept indication.

28. A component joined to a non-rigid substrate assembled in accordance with the method set forth in claim 26.

29. A component joined to a non-rigid substrate assembled in accordance with the method set forth in claim 27.

30. A component joined to a non-rigid substrate assembled in accordance with the method set forth in claim 26 wherein said non-rigid substrate is an organic material substrate and said pad is a bare copper pad.

31. A component joined to a non-rigid substrate assembled in accordance with the method set forth in claim 27 wherein said non-rigid substrate is an organic material substrate and said pad is a bare copper pad.

32. A component joined to a non-rigid substrate assembled in accordance with the method set forth in claim 26 wherein said non-rigid substrate is an organic material substrate.

33. An apparatus for bonding a metallic lead to a metallic pad disposed on a non-rigid substrate comprising:
   support means for supporting a lead superimposed on a pad disposed on a non-rigid substrate;
   an ultrasonic bonder including a tip, the tip having a frontal surface for engaging a lead to be bonded to a pad, said tip having a cavity centrally disposed and extending from said frontal surface, said frontal surface having two crossed grooves intersecting in the region of said cavity;
   laser energy source means coupled to said tip for providing laser energy pulses to said cavity for heating said frontal surface; and
   synchronizer means coupled to said support means, said ultrasonic bonder and said laser energy source means for controlling operation of said support means, said ultrasonic bonder and said laser energy source means.

34. An apparatus as set forth in claim 33 wherein said support means comprises an x-y stepper.

35. An apparatus as set forth in claim 33 wherein said laser energy source means is coupled to said tip by optical fiber means.

36. An apparatus as set forth in claim 35 wherein said cavity having a diameter smaller than said optical fiber means diameter.

37. An apparatus as set forth in claim 33 wherein said cavity has a diameter substantially equal to 1 mil.

38. An apparatus as set forth in claim 33 further comprising means for analyzing a footprint in the lead, which footprint is impressed by said frontal surface into the lead during bonding.

39. An apparatus as set forth in claim 38 wherein said means for analyzing provides an output signal indicative of the quality of a bond.

40. An apparatus as set forth in claim 33 wherein said non-rigid substrate comprises an organic material substrate.

41. An apparatus as set forth in claim 33 wherein said laser energy source means comprises a shutter.

42. An apparatus for bonding a component having at least one metallic lead to a non-rigid substrate having at least one pad thereon comprising:
  support means for supporting a lead superposed on a respective pad on a non-rigid substrate;
  ultrasonic bonder means including a tip, the tip having a frontal surface for engaging a lead to bonded to a respective pad, said tip having a cavity centrally disposed and extending from said frontal surface, said frontal surface having two crossed grooves intersecting in the region of said cavity;
  laser energy source means coupled to said tip for providing laser energy pulses to said cavity for heating said frontal surface, and
  synchronizer means coupled to said support means, said ultrasonic bonder and said laser energy source means for controlling operation of said support means, said ultrasonic bonder and laser energy source means whereby each lead of a component is bonded to a respective pad on a non-rigid substrate for bonding the component to the non-rigid substrate.

43. An apparatus as set forth in claim 42, wherein said support means comprises an x-y stepper.

44. An apparatus as set forth in claim 42, wherein said laser energy source means is coupled to said tip by optical fiber means.

45. An apparatus as set forth in claim 44, wherein said cavity has a diameter smaller than said optical fiber means diameter.

46. An apparatus as set forth in claim 42, wherein said cavity has a diameter substantially equal to 1 mil.

47. An apparatus as set forth in claim 42 further comprising means for analyzing a footprint in the lead, which footprint is impressed by said frontal surface into the lead during bonding.

48. An apparatus as set forth in claim 47 wherein said means for analyzing provides an output signal indicative of the quality of a bond.

49. An apparatus as set forth in claim 42, wherein said non-rigid substrate comprises an organic material substrate.

50. An apparatus as set forth in claim 42, wherein said laser energy source comprises a shutter.

51. An apparatus as set forth in claim 33 wherein said crossed grooves intersect at a substantially 90° angle.

52. An apparatus as set forth in claim 42 wherein said crossed grooves intersect at a substantially 90° angle.

53. An apparatus for bonding a metallic lead to a metallic pad disposed on a non-rigid substrate comprising:
  support means for supporting a lead superimposed on a pad disposed on a non-rigid substrate;
  an ultrasonic bonder including a tip, the tip having a frontal surface for engaging a lead to be bonded to a pad, said tip having a cavity centrally disposed and extending from said frontal surface;
  laser energy source means coupled to said tip by optical fiber means for providing laser energy pulses to said cavity for heating said frontal surface; and
  synchronizer means coupled to said support means, said ultrasonic bonder and said laser energy source means for controlling operation of said support means, said ultrasonic bonder and said laser energy source means.

54. An apparatus as set forth in claim 53 wherein said support means comprises an x-y stepper.

55. An apparatus as set forth in claim 53 wherein said cavity has a diameter smaller than said optical fiber means diameter.

56. An apparatus as set forth in claim 53 wherein said cavity has a diameter substantially equal to 1 mil.

57. An apparatus as set forth in claim 53 further comprising means for analyzing a footprint in the lead, which footprint is impressed by said frontal surface into the lead during bonding.

58. An apparatus as set forth in claim 57 wherein said means for analyzing provides an output signal indicative of the quality of a bond.

59. An apparatus as set forth in claim 53 wherein said non-rigid substrate comprises an organic material substrate.

60. An apparatus as set forth in claim 53 wherein said laser energy source means comprises a shutter.

61. An apparatus for bonding a component having at least one metallic lead to a non-rigid substrate having at least one pad thereon comprising:
  support means for supporting a lead superposed on a respective pad on a non-rigid substrate;
  ultrasonic bonder means including a tip, the tip having a frontal surface for engaging a lead to be bonded to a respective pad, said tip having a cavity centrally disposed and extending from said frontal surface;
  laser energy source means coupled to said tip by optical fiber means providing laser energy pulses to said cavity for heating said frontal surface, and
  synchronizer means coupled to said support means, said ultrasonic bonder and said laser energy source means for controlling operation of said support means, said ultrasonic bonder and laser energy source means whereby each lead of a component is bonded to a respective pad on a non-rigid substrate for bonding the component to the non-rigid substrate.

62. An apparatus as set forth in claim 61, wherein said support means comprises an x-y stepper.

63. An apparatus as set forth in claim 61, wherein said cavity has a diameter smaller than said optical fiber means diameter.

64. An apparatus as set forth in claim 61, wherein said cavity has a diameter substantially equal to 1 mil.

65. An apparatus as set forth in claim 61 further comprising means for analyzing a footprint in the lead, which footprint is impressed by said frontal surface into the lead during bonding.

66. An apparatus as set forth in claim 65 wherein said means for analyzing provides an output signal indicative of the quality of a bond.

67. An apparatus as set forth in claim 61, wherein said non-rigid substrate comprises an organic material substrate.

68. An apparatus as set forth in claim 61, wherein said laser energy source comprises a shutter.

* * * * *